US009698780B2

(12) United States Patent
Laurent

(10) Patent No.: US 9,698,780 B2
(45) Date of Patent: Jul. 4, 2017

(54) APPARATUS AND METHODS FOR LEAKAGE CURRENT REDUCTION IN INTEGRATED CIRCUITS

(71) Applicant: Micron Technology, Inc., Boise, ID (US)

(72) Inventor: Christophe Vincent Antoine Laurent, Agrate Brianza (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/163,510

(22) Filed: May 24, 2016

(65) Prior Publication Data
US 2016/0359486 A1    Dec. 8, 2016

Related U.S. Application Data

(60) Division of application No. 14/814,852, filed on Jul. 31, 2015, now Pat. No. 9,362,911, which is a (Continued)

(51) Int. Cl.
*H03K 17/16* (2006.01)
*H03K 19/00* (2006.01)
(Continued)

(52) U.S. Cl.
CPC ..... *H03K 19/0016* (2013.01); *G06F 17/5022* (2013.01); *G06F 17/5045* (2013.01); *H03K 19/20* (2013.01)

(58) Field of Classification Search
CPC .... H03K 19/0016; H03K 3/037; G06F 3/037; G06F 17/50; G06F 17/5009;
(Continued)

(56) References Cited

U.S. PATENT DOCUMENTS 5,587,672 A * 12/1996 Ranganathan ..... H03K 19/0963
326/93
6,169,419 B1    1/2001 De et al.
(Continued)

FOREIGN PATENT DOCUMENTS

KR    100357509    10/2002

OTHER PUBLICATIONS

ISA/KR, International Search Report and Written Opinion of the International Searching Authority, Int'l Appl. No. PCT/US2014/054524, Dec. 9, 2014, Korean Patent Office, Daejeon Metropolitan City, KR, 13 pgs.

*Primary Examiner* — Jason M Crawford
(74) *Attorney, Agent, or Firm* — Holland & Hart LLP

(57) ABSTRACT

This disclosure relates to leakage current reduction in integrated circuits (ICs). In one aspect, an IC can include a digital logic circuit and a polarization circuit. The digital logic circuit can have a plurality of inputs and can include a plurality of logic gates. The polarization circuit can receive a standby signal and a digital input signal comprising a plurality of bits. When the standby signal is deactivated, the polarization circuit can control the plurality of inputs of the digital logic circuit based on the digital input signal. However, when the standby signal is activated the polarization circuit can control the plurality of inputs of the digital logic circuit to a low power state associated with a smaller leakage current of the plurality of logic gates relative to at least one other state of the digital logic circuit.

9 Claims, 7 Drawing Sheets

Related U.S. Application Data continuation of application No. 14/025,529, filed on Sep. 12, 2013, now Pat. No. 9,100,002.

(51) Int. Cl.
*G06F 17/50* (2006.01)
*H03K 19/20* (2006.01)

(58) Field of Classification Search
CPC ............ G06F 17/2055; G06F 17/5027; G06F 17/5045; G05B 19/145
USPC .......................................... 326/21–34, 93–98
See application file for complete search history.

(56) References Cited

U.S. PATENT DOCUMENTS

| | | | |
|---|---|---|---|
| 7,102,382 B2 * | 9/2006 | Drenth | H03K 19/0016 326/37 |
| 7,639,039 B2 | 12/2009 | Oh | |
| 7,948,263 B2 | 5/2011 | Kim et al. | |
| 8,253,438 B2 | 8/2012 | Hoberman et al. | |
| 8,456,193 B2 | 6/2013 | Sethuram et al. | |
| 8,736,332 B2 * | 5/2014 | Sriadibhatla | H03K 19/0008 327/199 |
| 9,100,002 B2 * | 8/2015 | Laurent | H03K 19/0016 |
| 9,362,911 B2 * | 6/2016 | Laurent | H03K 19/0016 |
| 2012/0068734 A1 * | 3/2012 | Sethuram | G01R 31/31834 326/46 |

* cited by examiner

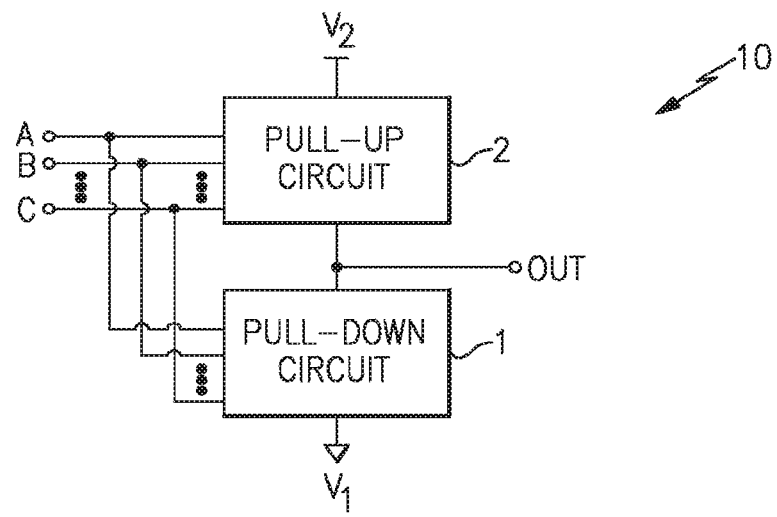
FIG.1
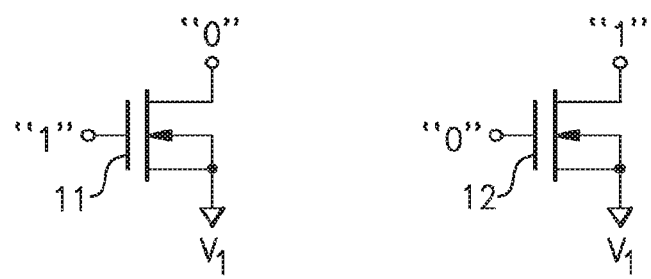
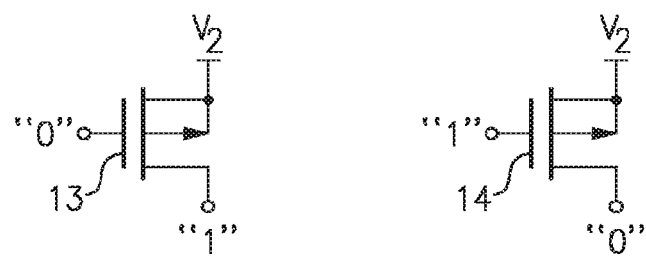
FIG.2

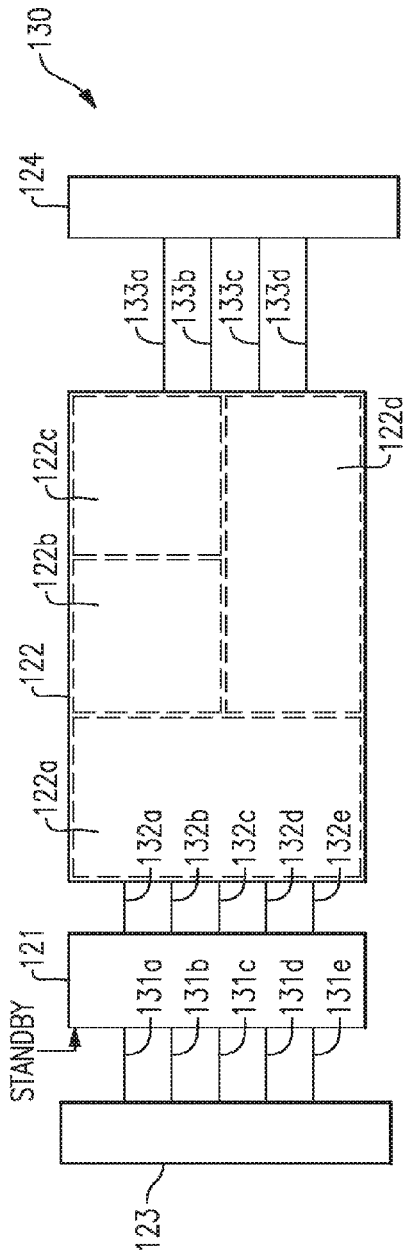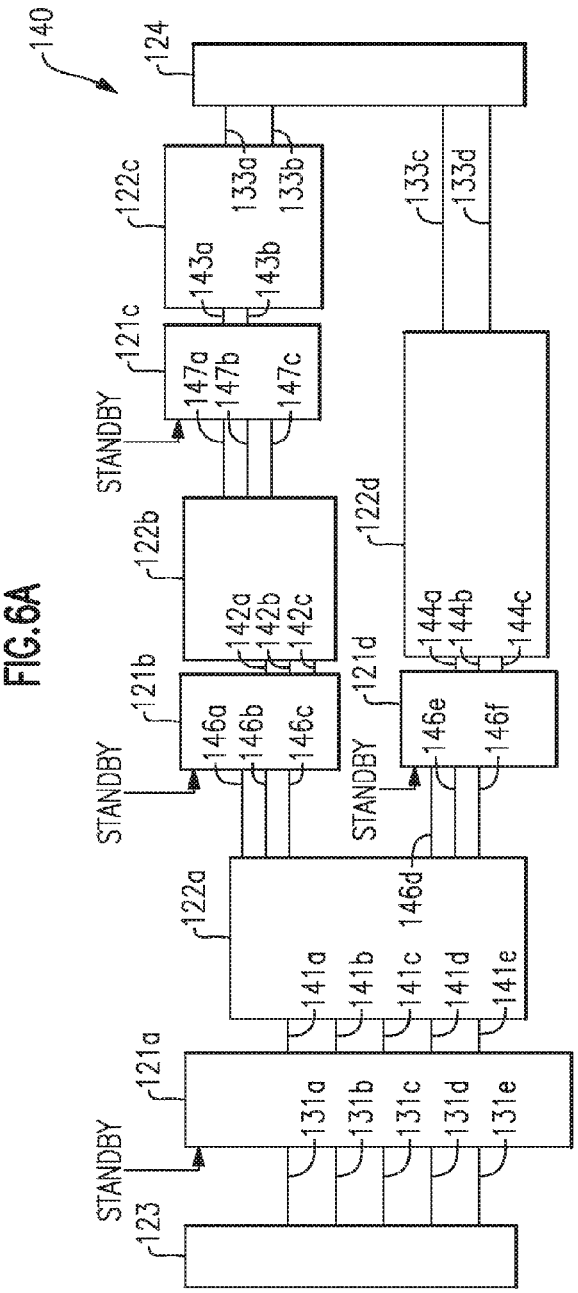

APPARATUS AND METHODS FOR LEAKAGE CURRENT REDUCTION IN INTEGRATED CIRCUITS

CROSS REFERENCES

The present Application for Patent claims priority to and is a divisional application of U.S. patent application Ser. No. 14/814,852 by Laurent, entitled "Apparatus and Methods for Leakage Current Reduction in Integrated Circuits," filed Jul. 31, 2015, now U.S. Pat. No. 9,362,911, issued Jun. 7, 2016, which is a continuation application of U.S. patent application Ser. No. 14/025,529 by Laurent, entitled "Apparatus and Methods for Leakage Current Reduction in Integrated Circuits," filed Sep. 12, 2013, now U.S. Pat. No. 9,100,002, issued Aug. 4, 2015, each of which is assigned to the assignee hereof, and expressly incorporated by reference in its entirety herein.

BACKGROUND

Technical Field

Embodiments of the invention generally relate to electronics, and, in particular, to leakage current reduction in integrated circuits (ICs).

Description of the Related Technology

Static power dissipation of an integrated circuit (IC) can be a relatively large component of the IC's overall power dissipation. For example, in certain memory ICs, static power dissipation can represent up to, for instance, 70% of the power dissipated by the IC. Additionally, as transistor dimensions become smaller with processing advancements, the density of transistors can increase and an IC's static power dissipation can increase relative to the IC's dynamic power dissipation. A relatively large amount of an IC's static power dissipation can be associated with leakage current of transistors.

Certain circuit design techniques can be used to reduce leakage current, and thus static power dissipation. For example, a circuit can use transistors having longer channel lengths and/or higher threshold voltages to reduce leakage current. However, such techniques may have a significant impact on circuit delay and/or area, or alone may provide an insufficient reduction in static power dissipation.

BRIEF DESCRIPTION OF THE DRAWINGS

These drawings and the associated description herein are provided to illustrate specific embodiments of the invention and are not intended to be limiting.

FIG. 1 is a schematic block diagram of one example of a digital logic gate.

FIG. 2 is a circuit diagram illustrating four examples of transistor polarizations.

FIGS. 6A and 6B are schematic block diagrams of two embodiments of electronic circuits.

To avoid repetition of description, components having the same or similar function may be referenced by the same reference number.

DETAILED DESCRIPTION OF CERTAIN EMBODIMENTS

Figure 3:
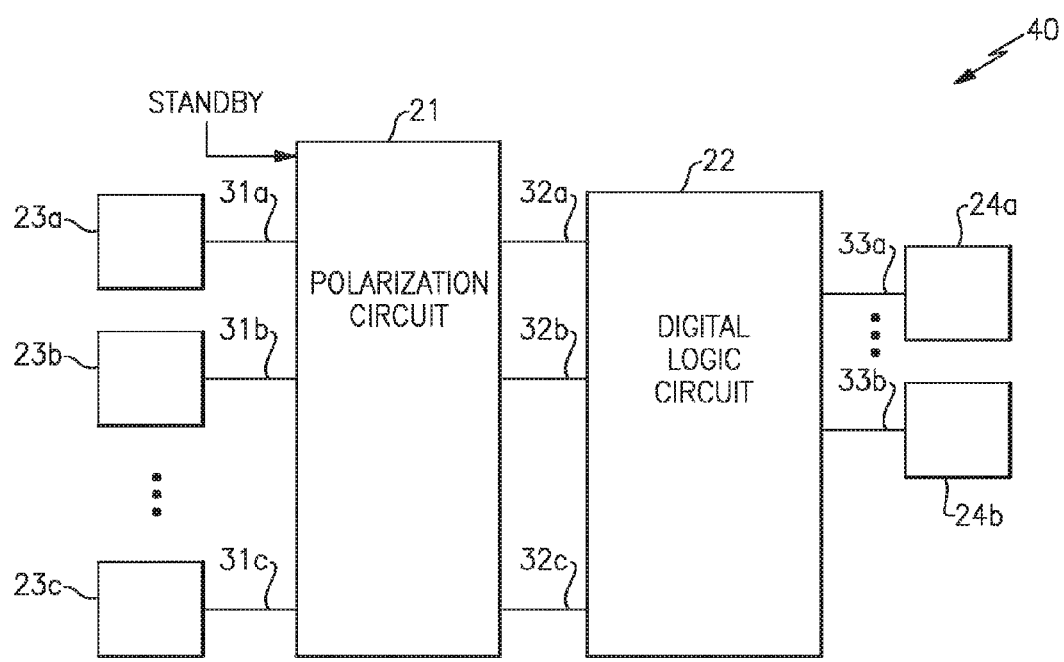
FIG. 3 is a schematic block diagram of an electronic circuit according to one embodiment.

Although particular embodiments are described herein, other embodiments, including embodiments that do not provide all of the benefits and features set forth herein, will be apparent to those of ordinary skill in the art.

FIG. 1 is a schematic block diagram of one example of a digital logic gate 10. The digital logic gate 10 includes a pull-down circuit 1 and a pull-up circuit 2. The digital logic gate 10 includes a first input A, a second input B, a third input C, and an output OUT. Although FIG. 1 illustrates a digital logic gate 10 that includes three inputs and one output, the teachings herein are applicable to digital logic gates having more or fewer inputs and/or additional outputs.

The pull-down circuit 1 is electrically connected between the output OUT and a first or power low supply voltage $V_1$. The pull-up circuit 2 is electrically connected between the output OUT and a second or power high supply voltage $V_2$. As persons having ordinary skill in the art will appreciate, the pull-down and pull-up circuits 1, 2 can be used to control a state of the output OUT to a logically high or low value based on a state of the inputs A, B, C. For example, the pull-down circuit 1 can include one or more transistors, such as n-type metal oxide semiconductor (NMOS) transistors used to control the output OUT to a logically low or "0" value for certain states of the inputs A, B, C. Additionally, the pull-up circuit 2 can include one or more transistors, such as p-type metal oxide semiconductor (PMOS) transistors used to control the output OUT to a logically high or "1" for certain input states. Examples of digital logic gates include, but are not limited to, inverters, buffers, NAND gates, NOR gates, AND gates, OR gates, XNOR gates, XOR gates, and multiplexers.

As used herein and as persons having ordinary skill in the art will appreciate, MOS transistors can have gates made out of metals and also materials that are not metals, such as polysilicon, and can have dielectric regions implemented not just with silicon oxide, but with other dielectrics, such as high-k dielectrics.

For certain ICs, the leakage current of digital logic gates, such as the digital logic gate 10 of FIG. 1, can represent a relatively large amount of the IC's static power dissipation.

FIG. 2 is a circuit diagram illustrating four examples of transistor polarizations.

The circuit diagram includes a first NMOS transistor 11 having a source electrically connected to the power low supply voltage $V_1$, a gate that receives a logical "1", and a drain that generates a logical "0". Additionally, the circuit diagram includes a second NMOS transistor 12 having a source electrically connected to the power low supply voltage $V_1$, a gate that receives a logical "0", and a drain controlled to a logical "1". Furthermore, the circuit diagram includes a first PMOS transistor 13 having a source electrically connected to the power high supply voltage $V_2$, a gate that receives a logical "0", and a drain that generates a logical "1". Additionally, the circuit diagram includes a second PMOS transistor 14 having a source electrically connected to the power high supply voltage $V_2$, a gate that receives a logical "1", and a drain controlled to a logical "0".

The transistors shown in FIG. 2 can have different drain-to-source (IDs) leakage current for the illustrated configurations. For example, the first NMOS transistor 11 can have a leakage current that is less than a leakage current of the second NMOS transistor 12, since the first NMOS transistor 11 can have a smaller drain-to-source (VDs) voltage that the second NMOS transistor 12. Similarly, the first PMOS transistor 13 can have a leakage current that is less than a leakage current of the second PMOS transistor 14, since the first PMOS transistor 13 can have a smaller $V_{DS}$ voltage that the second PMOS transistor 14.

Additionally, the second NMOS transistor 12 may have a leakage current that is greater than or less than that of the second PMOS transistor 14. For example, differences in leakage current between the NMOS transistor 12 and the PMOS transistor 14 can depend on a variety of factors, including, for example, a difference in widths or geometries of the transistors and/or on processing parameters, such as the transistor's relative threshold voltages.

The static power dissipation of a digital logic gate can depend on a state of the digital logic gate's inputs.

For example, with reference to FIGS. 1 and 2, the digital logic gate 10 can include transistors such as those shown in FIG. 2 in the gate's pull-down and pull-up circuits 1, 2. The transistors can be arranged in series, parallel, or combinations thereof to achieve a desired logical function of the gate.

Additionally, the digital logic gate 10 can have different amounts of static power dissipation depending on a state of the first, second, and third inputs A, B, C, since each state can be associated with a different combination of transistor polarizations. The state of the inputs corresponding to a smallest static power dissipation of the digital logic gate 10 can depend on a variety of factors, including, for example, a circuit configuration of the pull-down and pull-up circuits 1, 2, geometries of transistors in the pull-down and pull-up circuits 1, 2, and/or transistor parameters associated with a process used to fabricate the digital logic gate 10. Thus, the digital logic gate 10 can have a static power dissipation that depends on input state.

Although FIG. 1 describes static power dissipation in the context of a digital logic gate that includes pull-down and pull-up circuits, the teachings herein are applicable to configurations of digital circuitry implemented in other ways.

Examples of Integrated Circuits with Polarization Circuits

Apparatus and method for leakage reduction in ICs are described herein. In certain implementations, an electronic circuit includes a polarization circuit and a digital logic circuit. The polarization circuit can receive a digital input signal and a standby signal. When the standby signal is deactivated, the polarization circuit can provide the digital input signal to the inputs of the digital logic circuit, with or without inversion of the digital input signal's bits. However, when the standby signal is activated, the polarization circuit can control the inputs of the digital logic circuit to set the digital logic circuit in a low leakage state associated with smaller transistor leakage current relative to other states of the digital logic circuit. For example, in one embodiment, the polarization circuit can control the digital logic circuit's inputs so as to operate the digital logic circuit in a low leakage state having the lowest gate leakage current relatively to all other states of the digital logic circuit. Thus, when the standby signal is activated, the digital logic circuit can be controlled to a state associated with small static power dissipation.

FIG. 3 is a schematic block diagram of an electronic circuit 40 according to one embodiment. The electronic circuit 40 includes a polarization circuit 21, a digital logic circuit 22, first to third input state elements 23a-23c, and first and second output state elements 24a, 24b.

As shown in FIG. 3, the first input state element 23a generates a first input bit 31a of a digital input signal, the second input state element 23b generates a second input bit 31b of the digital input signal, and the third input state element 23b generates a third input bit 31c of the digital input signal. The polarization circuit 21 receives a standby signal STANDBY and the first to third input bits 31a-31c. Additionally, the polarization circuit 21 is configured to generate first, second, and third polarization bits 32a, 32b, and 32c, respectively, which are provided to the digital logic circuit 22 as an input. The first to third polarization bits 32a-32c can be referred to herein as a digital polarization signal. The digital logic circuit 22 generates a first output bit 33a and a second output bit 33b of a digital output signal. The first and second output bits 33a, 33b have been provided to the first and second output state elements 24a, 24b, respectively.

Persons having ordinary skill in the art will appreciate that the configuration shown in FIG. 3 is illustrative, and that the electronic circuit 40 can be modified in a variety of ways. For example, the electronic circuit 40 can include more or fewer input state elements and/or output state elements. Additionally, a number of input bits, polarization bits, and/or output bits of the circuit can vary depending on implementation. For example, in one embodiment, the input bits and polarization bits each comprise at least four bits. Furthermore, certain implementation details, such as clock signals and/or other circuitry, have been omitted from FIG. 3 for clarity.

As shown in FIG. 3, the polarization circuit 21 receives a standby signal STANDBY. In certain implementations, the polarization circuit 21 can operate to buffer or to invert the input bits 31a-31c to generate the polarization bits 32a-32c when the standby signal STANDBY is deactivated. Thus, when the standby signal STANDBY is inactive, the digital logic circuit 22 can generate the output bits 33a, 33b based on a state of the first to third input bits 31a-31c. For example, the digital logic circuit 22 can include a combinational logic circuit implemented to obtain a desired logical functional (for example, a truth table) between the output bits 33a, 33b and the input bits 31a-31c. In one embodiment, the digital logic circuit 22 does not include any state elements.

Accordingly, when the standby signal STANDBY is deactivated, the polarization circuit should not interfere with the processing of the input bits 31a-31c by the digital logic circuit 22.

However, when the standby signal STANDBY is activated, the polarization circuit 21 can control a state of the polarization bits 32a-32c to reduce the static power dissipation of the digital logic circuit 22. For example, in one embodiment, the standby signal STANDBY can be used to control a state of the polarization bits 32a-32c to a state corresponding to the lowest leakage current of the digital logic circuit 22 relative to all other states of the digital logic circuit's inputs.

By configuring the polarization circuit 21 in this manner, the digital logic circuit 22 can process the input bits 31a-31c during normal operation of the electronic circuit 40. However, during a standby mode, the polarization circuit 21 can control a state of the digital logic circuit 22 to a low leakage state to reduce the overall static power dissipation of the electronic circuit 40.

In one embodiment, when the electronic circuit 40 operates in a standby mode, the first and second output state elements 24a, 24b can be inhibited from loading the first and second output bits 33a, 33b. For example, in certain implementations, a clock signal used to control a loading operation of the first and second output state elements 24a, 24b can be disabled when the electronic circuit 40 operates in the standby mode. For instance, a transition of a clock signal such as a rising or falling edge can be used to load the output state elements, and the clock signal can be inhibited from transitioning during the standby mode. Configuring the electronic circuit 40 in this manner can prevent the output state elements 24a, 24b from being loaded with a logic value determined by the polarization circuit 21 rather than by the input bits 31a-31c.

As persons having ordinary skill in the art will appreciate, the standby signal STANDBY can be "activated" when the electronic circuit 40 operates in a standby mode, and the standby signal STANDBY can be "deactivated" when the electronic circuit 40 does not operate in the standby mode. In certain configurations, the standby signal STANDBY has a logical "1" value when activated and a logical "0" value when deactivated. In other configurations, the standby signal STANDBY has a logical "0" value when activated and a logical "1" value when deactivated.

Figure 4A:
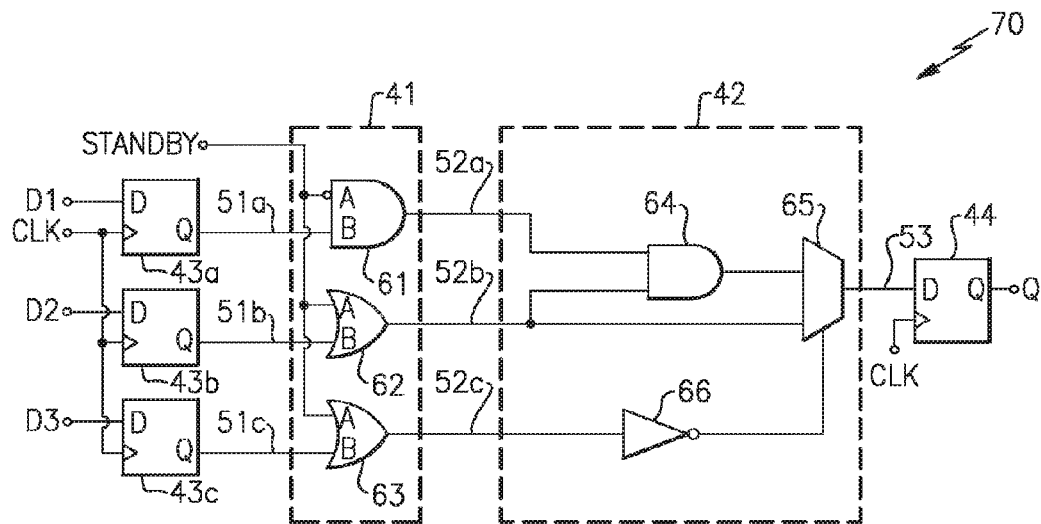
FIGS. 4A and 4B are circuit diagrams of electronic circuits according to various embodiments.
Figure 4B:
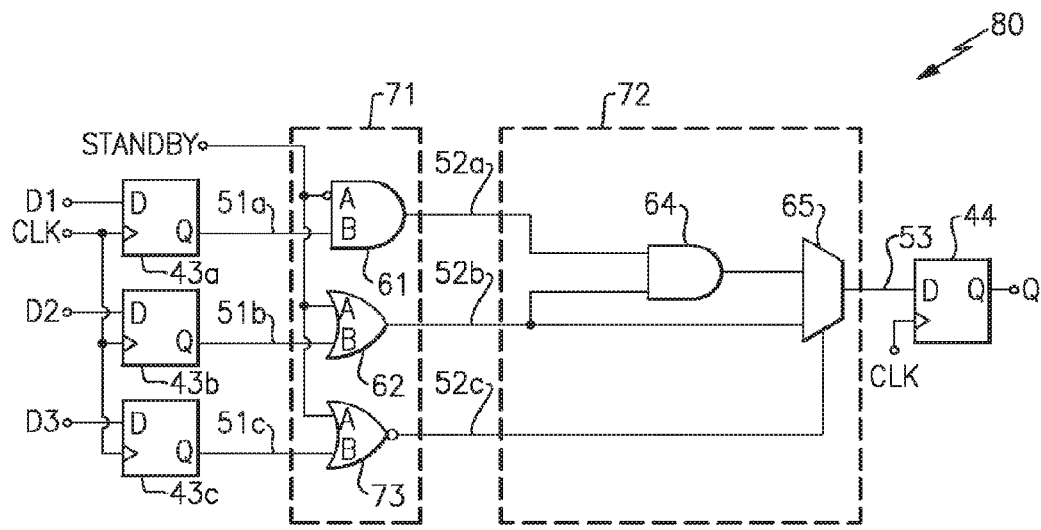

FIGS. 4A and 4B are circuit diagrams of electronic circuits according to various embodiments.

FIG. 4A is a circuit diagram of an electronic circuit 70. The electronic circuit 70 includes an polarization circuit 41, a digital logic circuit 42, first to third input flip-flops 43a-43c, and an output flip-flop 44.

The first to third input flip-flops 43a-43b receive a clock signal CLK and first to third flip-flop data bits D1-D3, respectively. Additionally, the first input flip-flop 43a generates a first input bit 51a, the second input flip-flop 43b generates a second input bit 51b, and the third input flip-flop 43b generates a third input bit 51c. The polarization circuit 41 receives the standby signal STANDBY and the first to third input bits 51a-51c, and generates the first to third polarization bits 52a-52c. The digital logic circuit 42 receives the first to third polarization bits 52a-52c and generates the output bit 53. The output flip-flop 44 receives the output bit 53 and the clock signal CLK, and generates a flip-flop output bit Q.

In the illustrated configuration, the first to third input flip-flops 43a-43b and the output flip-flop 44 are implemented as D flip-flops. However, other configurations are possible, such as implementations in which the input and/or output flip-flops are implemented using different state elements, including, for example, SR flip-flops, JK flip-flops, T flip-flops, latches, and/or a combination thereof.

The polarization circuit 41 includes a first logic gate 61, a second logic gate 62, and a third logic gate 63. In the illustrated configuration, the first logic gate 61 includes a first input A that receives the standby signal STANDBY, a second input B that receives the first input bit 51a, and an output that generates the first polarization bit 52a based on the logical function—A&B. Additionally, the second logic gate 62 includes a first input A that receives the standby signal STANDBY, a second input B that receives the second input bit 51b, and an output that generates the second polarization bit 52b based on the logical function A+B. Furthermore, the third logic gate 63 includes a first input A that receives the standby signal STANDBY, a second input B that receives the third input bit 51c, and an output that generates the third polarization bit 52c based on the logical function A+B.

The digital logic circuit 42 includes a two-input AND gate 64, a two-input multiplexer 65, and an inverter 66. In the illustrated configuration, the two-input AND gate 64 computes a logical "AND" of the first and second polarization bits 52a, 52b, and provides the result to a first input of the two-input multiplexer 65. Additionally, the two-input multiplexer 65 receives the second polarization bit 52b as a second input and an inverted version of the third polarization bit 52c generated by the inverter 66 as a selection control input. The output bit 53 generated by the two-input multiplexer 65 is provided to an input of the output flip-flop 44.

When the standby signal STANDBY has a logical "0" value, the first to third polarization bits 52a-52c can have logic values corresponding to the logic values of the first to third input bits 51a-51c, respectively. Thus, in the illustrated configuration, the polarization circuit 41 should not interfere with the logical operation of the digital logic circuit 42 during normal operation of the electronic circuit 70.

However, when the standby signal STANDBY has a logical "1" value, the polarization circuit 41 can force the first polarization bit 52a to a logical "0", the second polarization bit 52b to a logical "1", and the third polarization bit 52c to a logical "1".

Thus, the polarization circuit 41 can be used to pass the input bits 51a-51c to the digital logic circuit 42 when the standby signal STANDBY is logically low and to control the polarization bits 52a-52c to a particular state when the standby signal STANDBY is logically high.

Additionally, the state to which the polarization circuit 41 controls the first to third polarization bits 52a-52c during the standby mode can correspond to a low leakage state of the digital logic circuit 42. For example, a leakage current of the digital logic circuit 42 can be simulated and/or measured to determine which input state of the digital control circuit 42 has the smallest leakage current. Additionally, the polarization circuit 41 can be implemented to include a combination of gates that determine the desired state of the polarization bits 52a-52c in the standby mode.

For example, during the standby mode, the polarization circuit 41 can be implemented to control the first polarization bit 52a to a logical "0", the second polarization bit 52b to a logical "1", and the third polarization bit 52c to a logical "1". However, the polarization circuit 41 can include a different combination of logic gates to achieve a desired logical value of the polarization bits 52a-52c when the standby signal STANDBY is activated. For example, in one embodiment, the polarization circuit 41 includes a plurality of logic gates including a first input that receives the standby signal STANDBY and a second input that receives a particular bit of the digital input signal. Additionally, the type of logic gates in the polarization circuit 41 can be selected to obtain a particular state of the polarization bits 52a-52c when the standby signal STANDBY is activated.

In one embodiment, the standby signal STANDBY corresponds to a sleep mode of a memory chip, such as a dynamic random access memory (DRAM).

The state of a digital logic circuit having low or small leakage current can be dependent on the circuit implementation of the digital logic circuit, including, for example, a type of gates used, an arrangement of the gates in a logic cone, and/or a size or drive strength of the gates. As used herein, a "logic cone" can refer to a set of digital logic gates bounded between the outputs of one or more input state elements and the inputs of one or more output state elements. Although FIG. 4A illustrates an example where the low leakage state corresponds to a value of "0" for the first polarization bit 52a, a value of "1" for the second polarization bit 52b, and a value of "1" for the third polarization bit 52c; this example is merely illustrative.

The illustrated digital logic circuit 42 illustrates one example of a digital logic circuit that can be used in accordance with the teachings herein. However, the teachings herein are applicable to any suitable digital logic circuit, such as any combinational logic circuit. Thus, although FIG. 4A illustrates the digital logic circuit 42 as including three inputs and one output, the example shown in FIG. 4A is merely illustrative. Thus, the teachings herein are applicable to configurations of digital logic circuits that include more or fewer inputs, more outputs, and/or more or fewer logic gates.

In one embodiment, a digital logic circuit comprises a plurality of standard cells. For example, the digital logic circuit can comprise a combinational logic circuit generated using a place-and-route electronic design automation (EDA) tool.

In one embodiment, when the standby signal STANDBY is asserted, the clock signal CLK is disabled. The clock signal CLK can be disabled in a variety of ways, such as by gating the clock signal CLK with the standby signal STANDBY. Disabling the clock signal CLK during standby mode can prevent the output flip-flop 44 from being loaded with a value of the output bit 53 that is determined by the polarization circuit 41 rather than the input bits 51a-51c. In certain implementations, the data bits D1-D3 can also be generated by one or more logic circuits that use a polarization circuit, and thus disabling the clock signal CLK can also prevent the input flip-flops 43a-43b from changing state in the standby mode.

FIG. 4B is a circuit diagram of an electronic circuit 80. The electronic circuit 80 includes a polarization circuit 71, a digital logic circuit 72, first to third input flip-flops 43a-43c, and an output flip-flop 44.

The electronic circuit 80 of FIG. 4B is similar to the electronic circuit 70 of FIG. 4A, except that the electronic circuit 80 of FIG. 4B illustrates a different configuration of a polarization circuit and a digital logic circuit. In particular, in contrast to the polarization circuit 41 of FIG. 4A that includes a third gate 63 implemented to provide an OR operation, the polarization circuit 71 of FIG. 4B includes a third gate 73 implemented to provide a NOR operation. Additionally, in contrast to the digital logic circuit 42 of FIG. 4A that includes the inverter 66, the digital logic circuit 72 omits the inverter 66.

The electronic circuit 80 of FIG. 4B and the electronic circuit 70 of FIG. 4A can have a logically equivalent operation. However, the electronic circuit 80 of FIG. 4B illustrates an implementation of the electronic circuit 70 of FIG. 4A in which the OR gate 63 and the inverter 66 of FIG. 4A have been omitted in favor of using the NOR gate 73 of FIG. 4B. In certain implementations herein, one or more gates of a polarization circuit and a digital circuit can be combined to reduce or minimize an overall gate count. For example, the electronic circuit 80 of FIG. 4B can include one fewer gates relative to the electronic circuit 70 configuration of FIG. 4A.

Figure 5:
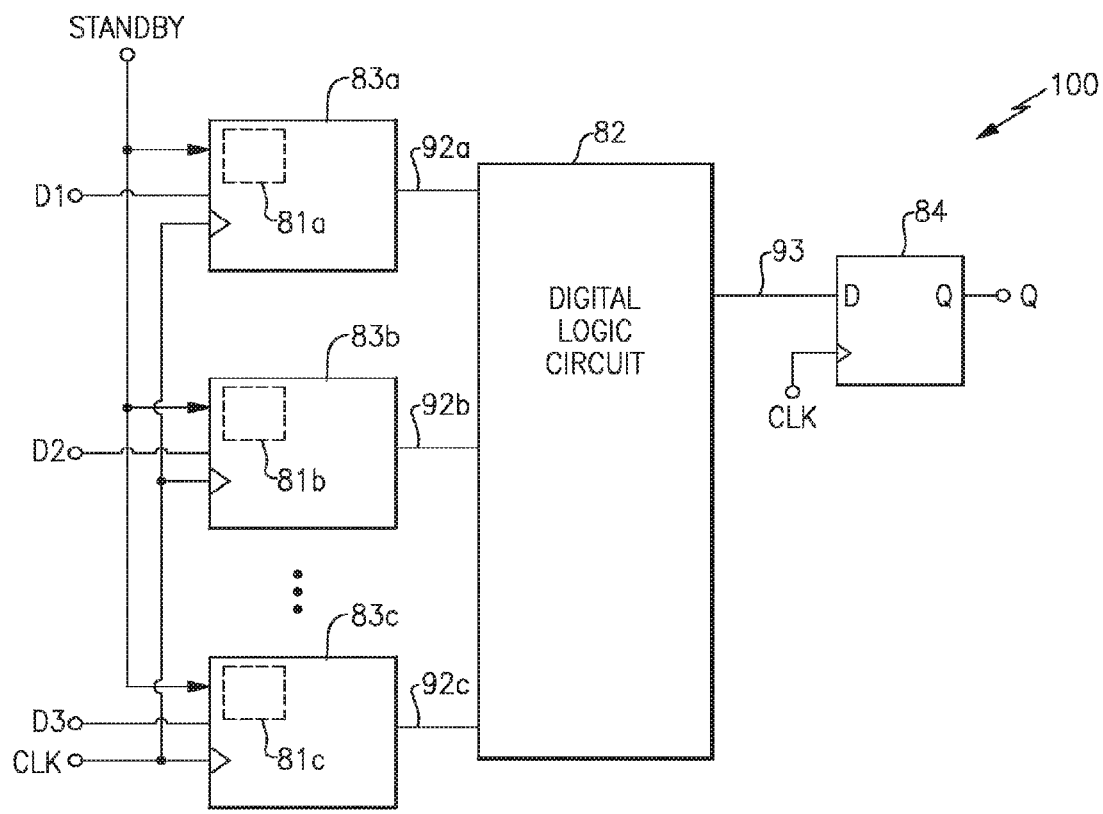
FIG. 5 is a schematic block diagram of an electronic circuit according to another embodiment.

FIG. 5 is a schematic block diagram of an electronic circuit 100 according to another embodiment. The electronic circuit 100 includes first to third polarization circuit components 81a-81c, a digital logic circuit 82, first to third input flip-flops 83a-83c, and an output flip-flop 84.

The first to third input flip-flops 83a-83b receive a clock signal CLK, a standby signal STANDBY, and first to third flip-flop data bits D1-D3, respectively. Additionally, the first input flip-flop 83a generates a first polarization bit 92a, the second input flip-flop 83b generates a second polarization bit 92b, and the third input flip-flop 83b generates a third polarization bit 92c. The digital logic circuit 82 receives the first to third polarization bits 92a-92c and generates the output bit 93. The output flip-flop 84 receives the output bit 93 and the clock signal CLK, and generates a flip-flop output bit Q.

In the illustrated configuration, the polarization circuit has been integrated into the first to third input flip-flops 83a-83c. For example, the first input flip-flop 83a includes the first polarization circuit component 81a, the second input flip-flop 83b includes the second polarization circuit component 81b, and the third input flip-flop 83b includes the third polarization circuit component 81c. In one embodiment, circuit layouts of the first to third polarization circuit components 81a-81c are integrated into the circuit layouts of the first to third input flip-flops 83a-83c, respectively. Thus, in certain implementations herein, a polarization circuit is integrated within a circuit layout of the state elements. As will be described in detail further below, configuring the polarization circuit in this manner can facilitate the design of a circuit using a polarization circuit.

The polarization circuit components 81a-81c can be used to control a state of the flip-flop's output when the standby signal STANDBY is activated. For instance, the first to third polarization circuit components 81a-81c can be used to implement the logical operations of the first to third gates 61-63 of FIG. 4A, respectively, or to otherwise achieve a particular state of the polarization bits 92a-92c when the standby signal STANDBY is activated.

FIG. 6A is a schematic block diagram of another embodiment of an electronic circuit 130. The electronic circuit 130 includes a polarization circuit 121, a digital logic circuit 122, a bank of input state elements 123, and a bank of output state elements 124.

As shown in FIG. 6A, the bank of input state elements 123 generates first to fifth input bits 131a-131e of a digital input signal. The bank of input state elements 123 can include flip-flops or other state elements for storing a value of the digital input signal. The polarization circuit 121 receives the standby signal STANDBY and the first to fifth input bits 131a-131e, and generates first to fifth polarization bits 132a-132e. The digital logic circuit 122 receives the first to fifth polarization bits 132a-132e and generates first to fourth output bits 133a-133d of a digital output signal, which has been provided to the bank of output state elements 124. The bank of output state elements 124 can include flip-flops or other state elements for storing a value of the digital output signal.

In the illustrated configuration, the digital logic circuit 122 includes a first digital logic subcircuit 122a, a second digital logic subcircuit 122b, a third digital logic subcircuit 122c, and a fourth digital logic subcircuit 122d. Each of the digital logic subcircuits 122a-122d can include one or more digital logic gates. Although FIG. 6A illustrates the electronic circuit 130 as including four digital logic subcircuits, the electronic circuit 130 can include more or fewer digital logic subcircuits and/or a different partition of subcircuits.

Persons having ordinary skill in the art will appreciate that the configuration shown in FIG. 6A is illustrative, and that the electronic circuit 130 can be modified in a variety of ways. For example, the electronic circuit 130 can use more or fewer input bits, polarization bits, and/or output bits.

Additional details of the electronic circuit 130 can be similar to those described earlier.

FIG. 6B is a schematic block diagram of another embodiment of an electronic circuit 140. The electronic circuit 140 includes first to fourth polarization circuits 121a-121d, first to fourth digital logic subcircuits 122a-122d, the bank of input state elements 123, and the bank of output state elements 124.

As shown in FIG. 6B, the bank of input state elements 123 generates an input signal including the input bits 131a-131e. Additionally, the first polarization circuit 121a receives the standby signal STANDBY and the input signal, and generates a first polarization signal including polarization bits 141a-141e. The first digital logic subcircuit 122a receives the first polarization signal and generates a first processed signal including bits 146a-146f. The second polarization circuit 121b receives the standby signal STANDBY and a first portion 146a-146c of the first processed signal, and generates a second polarization signal including bits 142a-142c. The second digital logic subcircuit 122b receives the second polarization signal and generates a second processed signal including bits 147a-147c. The third polarization circuit 121c receives the standby signal STANDBY and the second processed signal and generates a third polarization signal including bits 143a, 143b. The third digital logic subcircuit 122c receives the third polarization signal and generates a first portion 133a, 133b of the digital output signal. The fourth polarization circuit 121d receives the standby signal STANDBY and a second portion 146d-146f of the first processed signal, and generates a fourth polarization signal including bits 144a-144c. The fourth digital logic subcircuit 122d receives the fourth polarization signal and generates a second portion 133c, 133d of the digital output signal. The bank of output state elements 124 receives the digital output signal.

As described above, the electronic circuit 130 of FIG. 6A includes the polarization circuit 121 for reducing the static power dissipation of the digital logic circuit 122, which includes the first to fourth digital logic subcircuits 122a-122d. In contrast, the electronic circuit 140 of FIG. 6B includes first to fourth polarization circuits 121a-121d for reducing the static power dissipation of the first to fourth digital logic subcircuits 122a-122d, respectively.

In certain implementations, using multiple polarization circuits to reduce the static power dissipation of a digital logic circuit can provide a greater amount of leakage current reduction relative to a configuration using a single polarization circuit. For example, a digital logic circuit may contain a relatively large number of gates, and may have a lower overall static power dissipation in the standby mode when the digital logic circuit is partitioned into subcircuits having separate polarization circuits that can be individually optimized to reduce static power dissipation of a corresponding subcircuit.

Although the polarization circuit 120 of FIG. 6A and the first polarization circuit 121 of FIG. 6B both receive the first to fifth digital input bits 131a-131e, the digital logic gates of the polarization circuit 121 and of the first polarization circuit 121a need not be the same. For example, a state of the first to fifth polarization bits 132a-132e of FIG. 6A and a state of the first to fifth polarization bits 141a-141e of FIG. 6B can have different values when the standby signal STANDBY is asserted. For example, a state of the digital logic circuit 122 having a smallest overall static power dissipation can be different from a state of the first digital logic subcircuit 122a having a smallest overall static power dissipation.

Although FIG. 6B illustrates a particular partition of a digital logic circuit into four subcircuits, persons having ordinary skill in the art will appreciate that a digital logic circuit can be partitioned in a variety of ways. Accordingly, the teachings herein are applicable to configurations having more or fewer digital logic subcircuits and/or a different arrangement of digital logic subcircuits. Additionally, the number of inputs and outputs shown for each polarization circuit and digital logic subcircuit are illustrative, and the polarization circuits and/or digital logic subcircuits can include more or fewer inputs and/or outputs.

Figure 7:
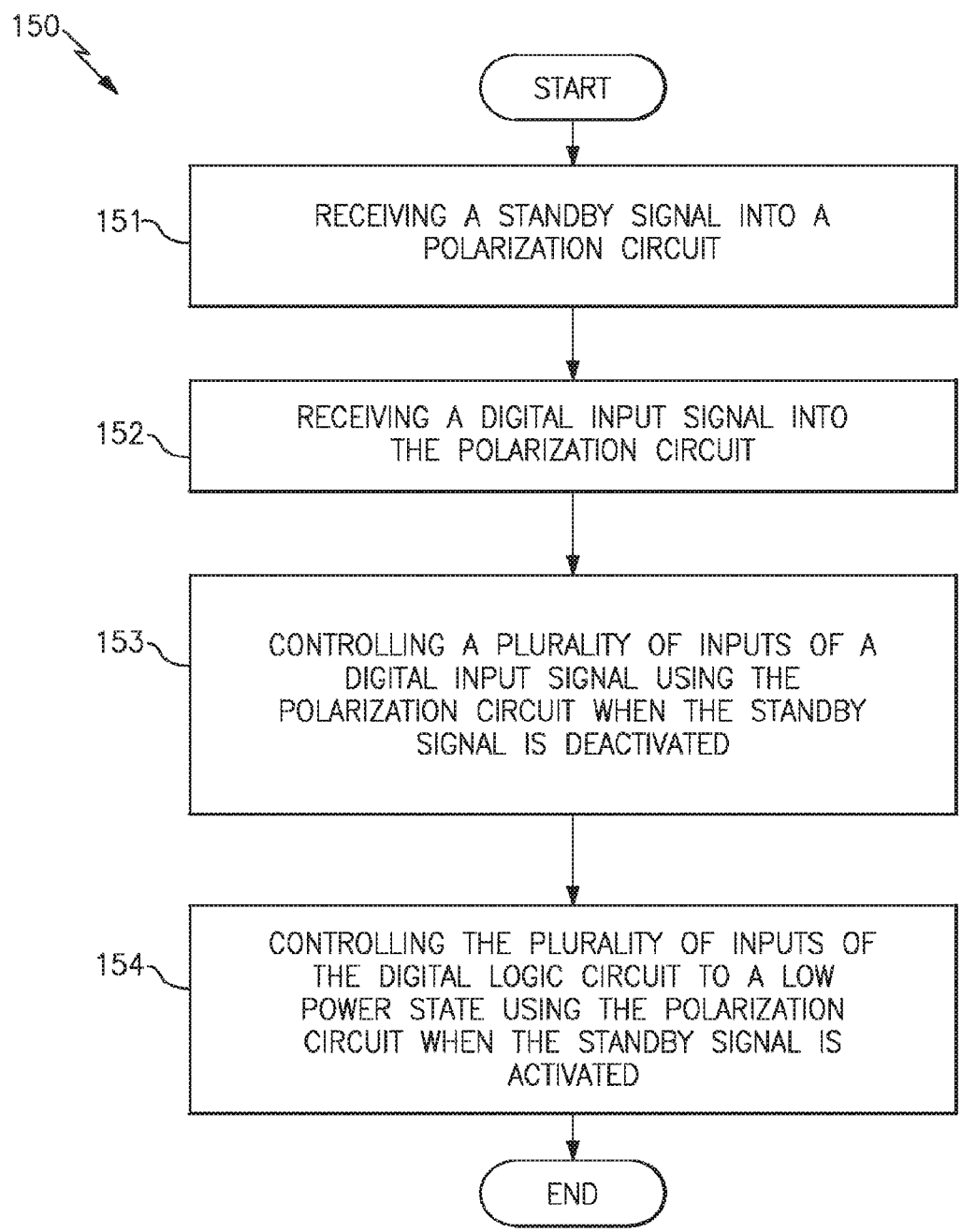
FIG. 7 is a flow diagram of an illustrative process of leakage reduction in a digital circuit according to one embodiment.

FIG. 7 is a flow diagram of an illustrative process 150 of leakage reduction according to one embodiment. The process 150 can be implemented, for example, by the electronic circuit 40 of FIG. 3. It will be understood that the process 150 can include greater or fewer operations than illustrated. Moreover, the operations of the process 150 can be performed in any order as appropriate.

At block 151, a standby signal is received in a polarization circuit. In a block 152, a digital input signal is received in the polarization circuit. In certain implementations, the standby signal indicates whether or not the electronic circuit is in a standby mode. The digital input signal can include a plurality of bits. In one embodiment, the polarization circuit includes a plurality of logic gates, each including a first input that receives the standby signal and a second input that receives a particular bit of the digital input signal.

The process 150 continues to a block 153, in which the polarization circuit is used to control a plurality of inputs of a digital logic circuit based on the input signal when the standby signal deactivated. The digital logic circuit can include a plurality of logic gates, such as standard cells. The digital logic circuit can be used to generate a digital output signal based on the digital input signal when the standby signal is deactivated.

At block 154, the polarization circuit is used to control the plurality of inputs of the digital logic circuit to a low power state when the standby signal is activated. The low power state is associated with a smaller leakage current of the plurality of logic gates relative to certain other states of the digital logic circuit. For example, the low power state can have the smallest leakage current of the plurality of logic gates relative to all other states of the digital logic circuit.

Although the process 150 is illustrated as including certain operations, the process 150 can be adapted in a variety of ways. For example, the process 150 can be implemented to include additional steps and/or can operate using a different order of operations.

Overview of Examples of Integrated Circuit Design Flows Using Polarization Circuits The polarization circuits herein can be implemented in a design flow of an integrated circuit (IC) in a variety of ways.

For example, an IC can include digital circuitry, such as synchronous digital circuitry including a digital logic circuit disposed between state elements. In certain implementations, the IC can include other circuitry, such as asynchronous digital circuitry, a memory array, and/or analog circuitry.

In certain implementations, the IC's synchronous digital circuitry is designed using conventional circuit design techniques, such as by using a logic synthesizer and place-and-route tools.

Thereafter, the leakage current of a digital logic circuit disposed between state elements can be simulated or otherwise evaluated for different input states to determine a low leakage state of the digital logic circuit suitable for use in a standby mode of the IC. Once a low leakage state of the digital logic circuit is determined, the design of the digital logic circuit can be modified to include a polarization circuit that controls the inputs of the digital logic circuit to the low leakage state during standby. In certain configurations, the resulting circuit can be further optimized, such as by combining logic gates of the polarization circuit and digital logic circuit to reduce gate count. One example of combining logic gates was described earlier with respect to FIGS. 4A-4B.

Although one example of a design flow using polarization circuits has been described, other design flows are possible.

For example, in one embodiment, an IC is designed using a library of flip-flops from which the flip-flops of the IC can be selected. The library of flip-flops includes a first type of flip-flop that receives a standby signal and controls the flip-flop's output to a logical "0" when the standby signal is activated. Additionally, the library of flip-flops includes a second type of flip-flop that receives the standby signal and controls the flip-flop's output to a logical "1" when the standby signal is activated. By selecting a combination of flip-flops of the first and second types at the inputs of a digital logic circuit, the digital logic circuit can be controlled to a particular state when the standby signal is activated. However, when the standby signal is deactivated, the flip-flops can operate in a conventional manner.

The low power state of a digital logic circuit of an IC can be determined in a variety of ways, and can be determined at least in part by simulating the digital logic circuit. For example, in one embodiment, the digital logic circuit is implemented using a plurality of standard cell logic gates. Additionally, leakage current can be simulated for each state of each standard cell to determine leakage data for the library of standard cells. Additionally, the overall leakage current of the digital logic circuit for a particular input state can be evaluated by determining the state that each standard cell operates in for that particular input state and summing the leakage currents of the standard cells. The particular input state the digital logic circuit operates in can be determined, for example, by a Boolean logic simulator or other software. Additionally, the low leakage state of the digital logic circuit can be determined by selecting the input state that has the lowest overall leakage current. Although one example of determining a low power state has been provided, other configurations are possible. For example, in one embodiment, the leakage current of the digital logic circuit is evaluated for each input state using a circuit simulation tool.

In certain implementations, a digital logic circuit can be subdivided into two or more subcircuits, and polarization circuits can be placed at the inputs of some or all of the subcircuits. Additionally, each of the polarization circuits can be used to reduce leakage current of a corresponding digital logic subcircuit. Accordingly, in certain implementations, a polarization circuit can be disposed within a digital logic circuit, and can be used to control leakage current of a portion or subcircuit of the digital logic circuit. Thus, as used herein a "digital logic circuit" may refer to a complete digital logic circuit between input and output state elements or to a portion of the same. Indeed, the teachings herein are applicable to configurations in which one or more digital logic gates are inserted between the outputs of input state elements and the inputs of a polarization circuit.

In certain configurations, a polarization circuit need not be included at the inputs of each digital logic circuit of an IC. For example a polarization circuit can have a certain leakage current overhead associated with the leakage current of the polarization circuit's logic gates. In certain implementations, the leakage current overhead of the polarization circuit is compared to the leakage current savings of the digital logic circuit, and the polarization circuit can be included when the leakage current overhead is less than the leakage current savings. In one embodiment, the leakage current savings can correspond to a difference in leakage current of the digital logic circuit in the low power state versus the average leakage current of the digital logic circuit across all input states of the digital logic circuit.

Furthermore, in the standby state, a particular input bit of the digital signal may already have the desired low power state value. Accordingly, in certain configurations, a polarization circuit can be omitted from an input of a digital circuit when the input already has the desired low power state value.

Additionally, in certain configurations, a polarization circuit can be omitted at the inputs of certain digital logic circuits to prevent unintended operation of the IC. For example, in one embodiment, a polarization circuit is not used to control the inputs of a digital logic circuit that controls an analog circuit, an asynchronous reset circuit, an IC mode control circuit, a clock control circuit, and/or any other sensitive circuit in which an input value change disturbs the proper functionality of the IC.

Figure 8:
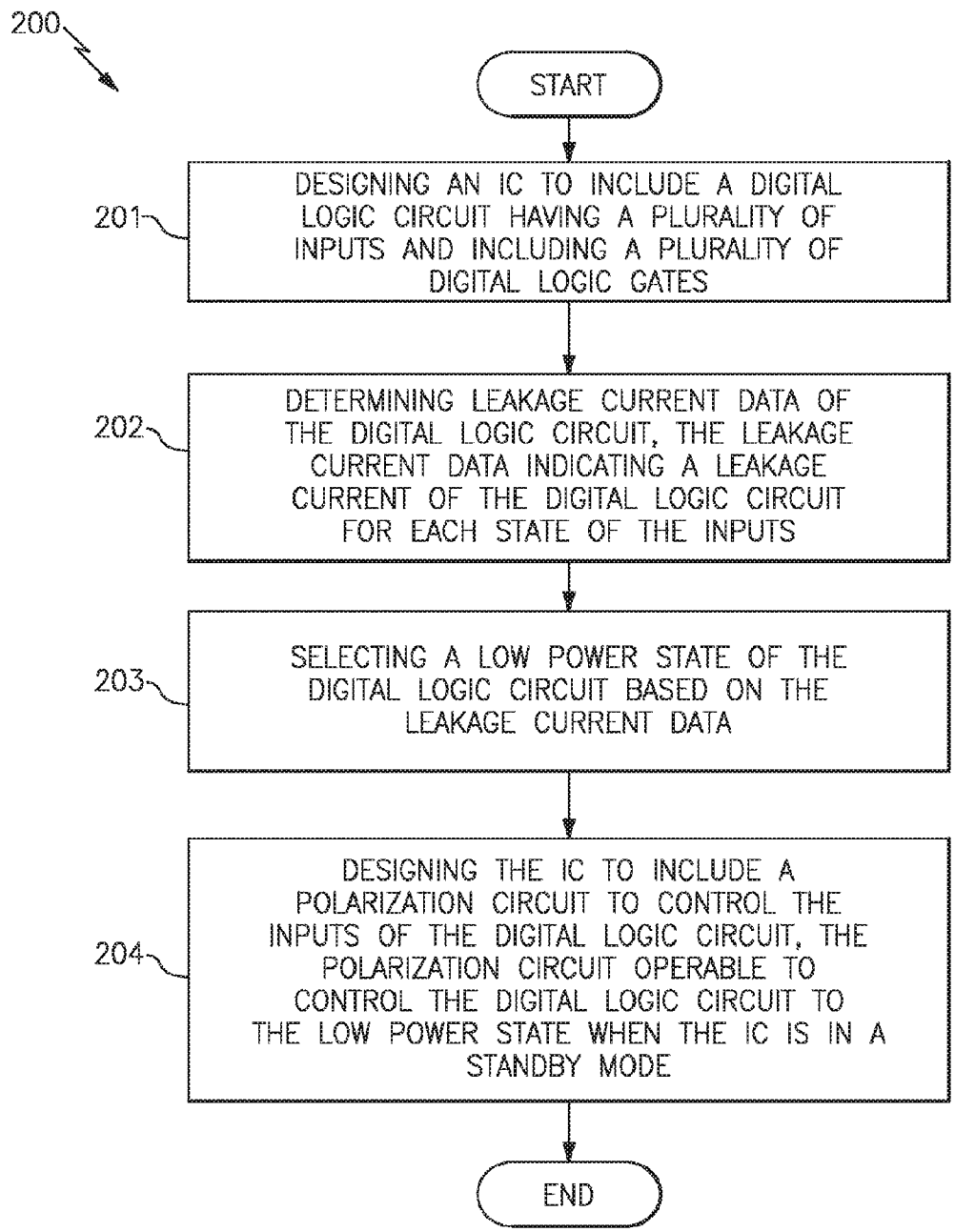
FIG. 8 is a flow diagram of an illustrative process of integrated circuit design according to one embodiment.

FIG. 8 is a flow diagram of an illustrative process 200 of integrated circuit design according to one embodiment.

At block 201, an IC is designed to include a digital logic circuit having a plurality of inputs and including a plurality of digital logic gates. The IC can be designed in a variety of ways, such as by using synthesis and place-and-route EDA tools.

The process 200 continues to a block 202, in which leakage current data of the digital logic circuit is determined. The leakage current data indicates a leakage current of the digital logic circuit for each state of the inputs. As described earlier, the leakage current of a digital logic circuit of an IC can be determined in a variety of ways, such as by simulation and/or evaluation.

At block 203, a low power state of the digital logic circuit is selected based on the leakage current data. The low power state is associated with a smaller leakage current of the plurality of logic gates relative to at least one other state of the digital logic circuit. In certain implementations, the low power state is associated with the smallest leakage current of the plurality of logic gates relative to all other states of the digital logic circuit.

The process 200 continues at a block 204, in which the IC is designed to include a polarization circuit to control the inputs of the digital logic circuit. The polarization circuit is operable to control the digital logic circuit to the low power state when the IC is in a standby mode.

Although the process 200 is illustrated as including certain operations, the process 200 can be adapted in a variety of ways. For example, the process 200 can be implemented to include additional steps and/or can operate using a different order of operations. For example, in one embodiment, the process 200 is adapted to include a step for partitioning a digital logic circuit into two or more subcircuits, and determining if an overall static power dissipation of the IC can be reduced by using multiple polarization circuits to separately control the state of the subcircuits during the standby mode.

CONCLUSION

In the embodiments described above, polarization circuits can be implemented in any integrated circuit with a need for reduced leakage current. As such, the polarization circuits described herein can be incorporated in various electronic devices. Examples of the electronic devices can include, but are not limited to, consumer electronic products, electronic circuits, electronic circuit components, parts of the consumer electronic products, electronic test equipment, etc.

Examples of the consumer electronic products include, but are not limited to, a mobile phone, a telephone, a television, a computer monitor, a computer, a hand-held computer, a laptop computer, a tablet computer, a personal digital assistant (PDA), a microwave, a refrigerator, a stereo system, a cassette recorder and/or player, a DVD player, a CD player, a VCR, an MP3 player, a radio, a camcorder, an optical camera, a digital camera, a washer, a dryer, a washer/dryer, a copier, a facsimile machine, a scanner, a multi-function peripheral device, a wrist watch, a clock, etc. Further, the electronic device can include unfinished products. The disclosed techniques are not applicable to mental steps, and are not performed within the human mind or by a human writing on a piece of paper.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Any combination of the features of the methods described herein may be embodied in code stored in a non-transitory computer readable medium. When executed, the non-transitory computer readable medium may cause some or all of any of the methods described herein to be performed. It will be understood that any of the methods discussed herein may include greater or fewer operations and that the operations may be performed in any order, as appropriate. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times. Moreover, it will be understood that the methods discussed herein are performed at least partly by physical circuitry. Accordingly, the claims are not intended to cover purely metal processes or abstract ideas.

Various embodiments have been described above. Although described with reference to these specific embodiments, the descriptions are intended to be illustrative and are not intended to be limiting. Various modifications and applications may occur to those skilled in the art.

What is claimed is:

1. A method of integrated circuit (IC) design, the method comprising:
   designing the IC to include a first digital logic circuit having a plurality of inputs and including a plurality of digital logic gates;
   determining leakage current data of the first digital logic circuit, wherein the leakage current data indicates a leakage current of the first digital logic circuit for each state of the plurality of inputs, wherein the leakage current data is determined at least in part by simulating the first digital logic circuit;
   selecting a low power state of the first digital logic circuit based at least in part on the leakage current data, wherein the low power state is associated with a smaller leakage current of the plurality of logic gates relative to at least one other state of the first digital logic circuit; and
   designing the IC to include a first polarization circuit to control the plurality of inputs of the first digital logic circuit, wherein the first polarization circuit is operable to control the first digital logic circuit to the low power state when the IC is in a standby mode.

2. The method of claim 1, further comprising:
   designing the IC to include a plurality of flip-flops, wherein designing the IC to include the first polarization circuit comprises implementing a first portion of the plurality of flip-flops using a first type of flip-flop and implementing a second portion of the plurality of flip-flops using a second type of flip-flop, wherein the first type of flip-flop outputs a logical "1" in the standby mode, and wherein the second type of flip-flop outputs a logical "0" in the standby mode.

3. The method of claim 1, further comprising:
   designing the IC to include a second digital logic circuit; and
   omitting a second polarization circuit to control a plurality of the inputs of the second digital logic circuit when the second digital logic circuit controls an input of a sensitive circuit, wherein a change of a value of the input of the sensitive circuit disturbs a functionality of the IC.

4. The method of claim 1, further comprising:
   designing the IC to include a second digital logic circuit;
   determining a leakage current overhead associated with including a second polarization circuit to control a plurality of inputs of the second digital logic circuit;
   determining a leakage current savings associated with including the second polarization circuit to control the plurality of inputs of the second digital logic circuit; and
   designing the IC to include the second polarization circuit when the leakage current overhead is less than the leakage current savings.

5. The method of claim 1, wherein determining leakage current data of the first digital logic circuit comprises simulating the first digital logic circuit using a circuit simulator.

6. The method of claim 1, further comprising:
designing the first polarization circuit of the IC to control the plurality of inputs of the first digital logic circuit based at least in part on a digital input signal when the IC is not in the standby mode.

7. The method of claim 1, wherein selecting the low power state of the first digital logic circuit comprises selecting a state of the first digital logic circuit having the smaller leakage current of the plurality of logic gates relative to all other states of the first digital logic circuit.

8. The method of claim 1, wherein including the first polarization circuit is based at least in part on comparing a leakage current overhead of the first polarization circuit and the leakage current of the first digital logic circuit.

9. The method of claim 1, wherein determining leakage current data of the first digital logic circuit is based at least in part on measuring a leakage current of each state of the plurality of inputs of the first digital logic circuit.

* * * * *